United States Patent [19]
Kitamura et al.

[11] Patent Number: 5,633,525
[45] Date of Patent: May 27, 1997

[54] LATERAL FIELD EFFECT TRANSISTOR

[75] Inventors: Akio Kitamura; Naoto Fujishima, both of Nagano, Japan

[73] Assignee: Fuji Electric Co., Ltd., Tokyo, Japan

[21] Appl. No.: 551,353

[22] Filed: Nov. 1, 1995

[30]  Foreign Application Priority Data

Nov. 11, 1994 [JP] Japan ................... 6-277294

[51] Int. Cl.$^6$ .................... H01L 29/74; H01L 29/76
[52] U.S. Cl. .................... 257/381; 257/141; 257/343; 257/401
[58] Field of Search .................... 257/141, 343, 257/381, 401

[56]  References Cited

FOREIGN PATENT DOCUMENTS 61-144872  7/1986  Japan ..................... 257/385

*Primary Examiner*—Mahshid D. Saadat
*Assistant Examiner*—Valencia Martin Wallace
*Attorney, Agent, or Firm*—Brumbaugh, Graves, Donohue & Raymond

[57]  ABSTRACT

A lateral field effect transistor includes a semiconductor substrate, a source region further with source region stripes formed on the semiconductor substrate, and a drain region with drain region stripes formed on the semiconductor substrate and spaced laterally from the source region stripes. In addition, the lateral field effect transistor includes a source electrode having a first source electrode layer connected to the source region via a source contact and a second source electrode layer straddling the source region stripes and the drain region stripes. The first source electrode layer and the second source electrode layer are separated by an inter-layer insulation film and connected via a source connection hole formed through the inter-layer insulation film. In addition, the lateral field effect transistor includes a drain electrode having a first drain electrode layer connected to the drain region via a drain contact and a second drain electrode layer straddling the source region stripes and the drain region stripes. The first drain electrode layer and the second drain electrode layer are separated by an inter-layer insulation film and connected via a drain connection hole formed through the inter-layer insulation film. The lateral field effect transistor also includes a source pad disposed on the second source electrode layer and a drain pad disposed on the second drain electrode layer.

7 Claims, 8 Drawing Sheets

LATERAL FIELD EFFECT TRANSISTOR

BACKGROUND OF THE INVENTION

The present invention relates to a lateral field effect transistor (hereinafter referred to as "MOSFET") and, more particularly, to a lateral MOSFET with low on-resistance.

It is desirable to lower the on-resistance of the devices incorporated in electronic instruments as well as their power consumption and power supply voltage in order to make them portable. Switching elements with very low on-resistance of less than several tens mΩ are especially desirable. Lateral field effect transistors are suitable for this purpose because their on-voltage is low, especially in a small current range, as they do not have p-n junctions which a current must traverse.

FIG. 10 is a cross section of a lateral field effect transistor. The MOSFET chip 100 shown has a metal oxide film semiconductor (MOS) type gate. FIG. 11 is a top plan view of the MOSFET of FIG. 10.

Referring now to FIG. 10, a p-type well region 103 is formed on a p-type substrate 101. A p-type base region 104 is formed in a surface layer of the p-type well region 103. An n-type source region 105 is then formed in a surface layer of the p-type base region 104. An n-type offset region 106 is also formed in the surface layer of the p-type well region 103. A narrow channel separates the n-type offset region 106 from the p-type base region 104. A thick oxide film (LOCOS) 112 is formed on a part of the n-type offset region 106. An n-type drain region 107 is formed on a part of the n-type offset region 106 away from the p-type base region 104.

A poly-crystalline silicon gate electrode 109 is fixed via a gate oxide film 108 to the region extending between the n-type source region 105 and the n-type offset region 106. A source electrode 110 is fixed commonly to the n-type source region 105 and the p-type base region 104 via a source contact 114. A drain electrode 111 is fixed to the n-type drain region 107 via a drain contact 115.

When a positive signal is fed to the gate electrode 109 of the lateral MOSFET while a voltage is applied between the drain electrode 111 and source electrode 110, an inversion layer is created in the surface layers of the p-type base region 104 and the p-type well region 103. As the inversion layer is created, a current flows between the drain electrode 111 and source electrode 110. When the signal is removed from the gate electrode 109, the inversion layer vanishes and the current flow between the drain electrode 111 and source electrode 110 is interrupted.

In MOSFETs, the n-type source region 105 and the n-type drain region 107 are often formed in stripes so as to elongate the opposed facing length of the n-type source region 105 and the n-type drain region 107. A zone delimited by the line F—F' and the line G—G' of FIG. 10 is inverted and repeated many times on the substrate.

Respective electrodes fixed to each zone are formed in stripes and are connected at their ends forming combtooth-like electrodes. In some cases, the n-type source region 105 and the n-type drain region 107 are often shaped into combtooth-like regions. The left side part of the p-type base region 104, i.e., the outermost p-type base region in FIG. 10, is covered with the thick LOCOS film 112. A withstand voltage structure that sustains the breakdown voltage of the device is located on the further left side of the figure. The withstand voltage structure, however, is not illustrated and its explanation is omitted since the present invention does not relate to the withstand voltage structure.

Referring now to FIG. 11, a region surrounded by dotted lines indicates the source contact region 114 contacting the n-type source region 105 or the drain contact region 115 contacting the n-type drain region 107. A region surrounded by bold solid lines indicates the source electrode 110 or the drain electrode 111. A source pad 116 is formed at the end of the source electrode 110. A drain pad 117 is formed at the end of the drain electrode 111. Both the source pad 116 and the drain pad 117 are not covered by a passivation film in order to facilitate wire bonding. In addition, a gate pad 124 is connected with the gate electrode 109.

As the on-resistance is lowered, the on-resistance midway to the electrode for external wiring, i.e., the ratio of the wiring resistance to the total on-resistance is not negligible any more. To solve this problem, the metal wiring is widened toward the downstream side so as to reduce the wiring resistance. R. K. Williams et al., "Design and Operation of a Fully Integrated BiC/DMOS Head-Actuator PIC for Computer Hard-Disk Drives," *IEEE Transaction of Electron Devices*, Vol. 38, No. 7, p. 1590 (1991). However, an on-resistance of less than 10 mΩ would be difficult to obtain without increasing the chip area, which, in turn, increases the cost.

In view of the foregoing, it is desirable to provide a lateral field effect transistor having low on-resistance while maintaining the same chip area.

SUMMARY OF THE INVENTION

The object of the invention is attained by a lateral field effect transistor that comprises a semiconductor substrate, a source region further comprising source region stripes formed on the semiconductor substrate, a drain region further comprising drain region stripes formed on the semiconductor substrate and spaced laterally from the source region stripes, a source electrode further comprising a first source electrode layer connected to the source region via at least one source contact and a second source electrode layer straddling the source region stripes and the drain region stripes, the first source electrode layer and the second source electrode layer being separated by an inter-layer insulation film and connected via at least one source connection hole formed through the inter-layer insulation film, a drain electrode further comprising a first drain electrode layer connected to the drain region via at least one drain contact and a second drain electrode layer straddling the source region stripes and the drain region stripes, the first drain electrode layer and the second drain electrode layer being separated by an inter-layer insulation film and connected via at least one drain connection hole formed through the inter-layer insulation film; a source pad for wire bonding, the source pad being disposed on the second source electrode layer; and a drain pad being disposed on the second drain electrode layer. In this manner, the chip size of the lateral MOSFET is reduced without increasing the chip area for the bonding pads. Additionally, since the source region and the drain region are widened without increasing chip size and since the electrode wiring length is shortened, the on-resistance of the lateral MOSFET is reduced.

In accordance with an aspect of the invention, the source connection hole is formed beneath the second source electrode layer and the drain connection hole beneath the second drain electrode layer. In this manner, the second source electrode layer, the second drain electrode layer and the bonding pads are widened. Accordingly, thick bonding wires can be used.

In accordance with an aspect of the invention, the source connection hole is disposed above the source region stripes and the drain connection hole above the drain region stripes. Accordingly, the electrode wiring length is greatly shortened and the wiring resistance is reduced.

In accordance with an aspect of the invention, the source contact and the source connection hole are displaced laterally from each other, and the drain contact and the drain connection hole are displaced laterally from each other. In this manner, the flattening process of the first electrode layers is avoided and manufacturing of the lateral MOSFET is facilitated.

In accordance with an aspect of the invention, the first source electrode layer is wider than the first drain electrode layer beneath the second drain electrode layer and the first drain electrode layer is wider than the first source electrode layer beneath the second source electrode layer, so that a current can flow from the semiconductor regions beneath the source pad directly to the source pad. Accordingly, the width of the first source electrode layer is minimized while the width of the first drain electrode layer is maximized so that the drain wiring resistance is reduced. Similarly, the source wiring resistance is reduced by maximizing the width of the source wiring beneath the drain pad.

BRIEF DESCRIPTION OF THE DRAWINGS

Hereinafter, the present invention will be explained with reference to the accompanied drawing figures, wherein.

DETAILED DESCRIPTION OF THE INVENTION

Figure 2:
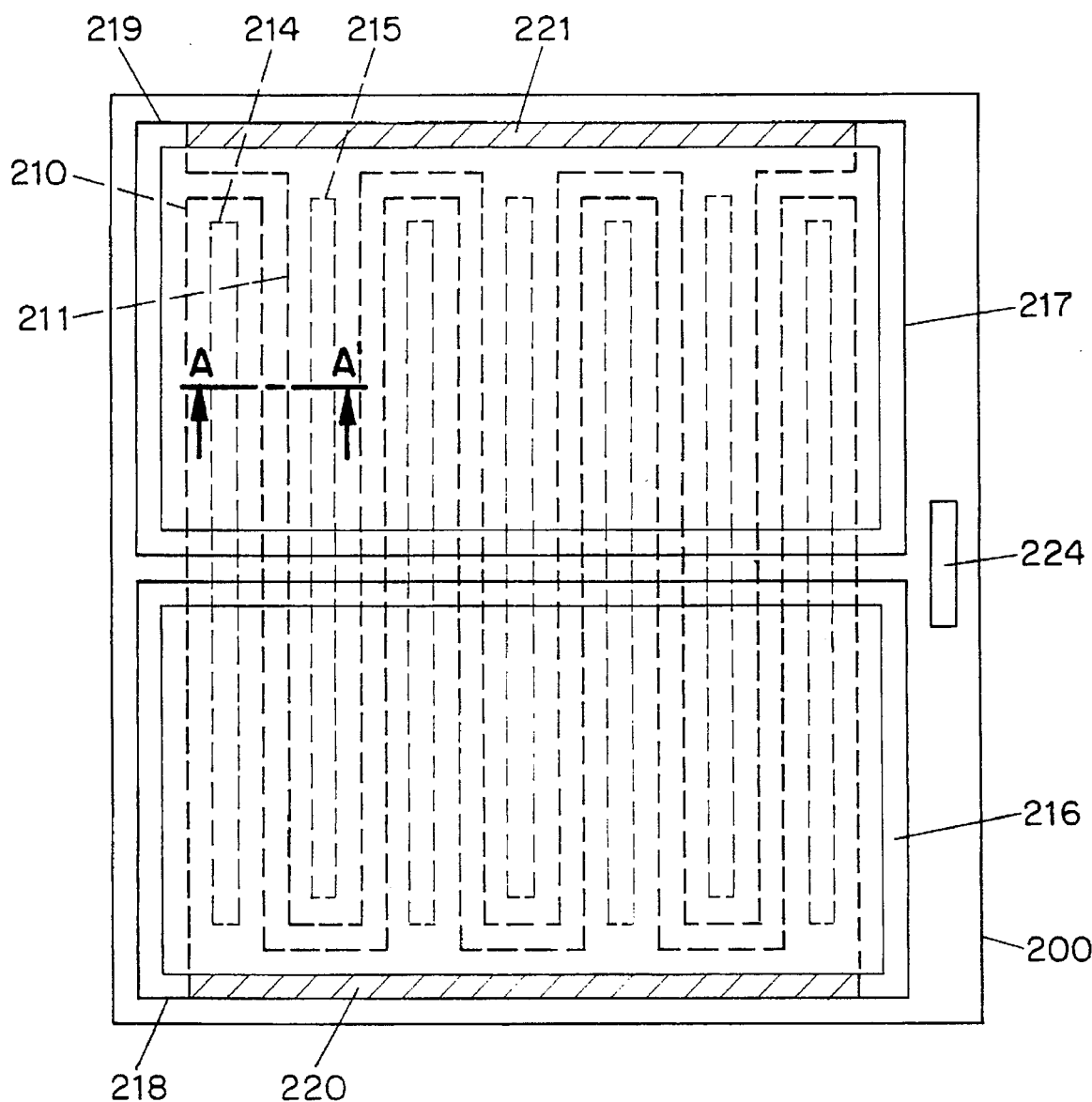
FIG. 2 is a top plan view of the first embodiment of a lateral MOSFET according to the present invention.
Figure 3:
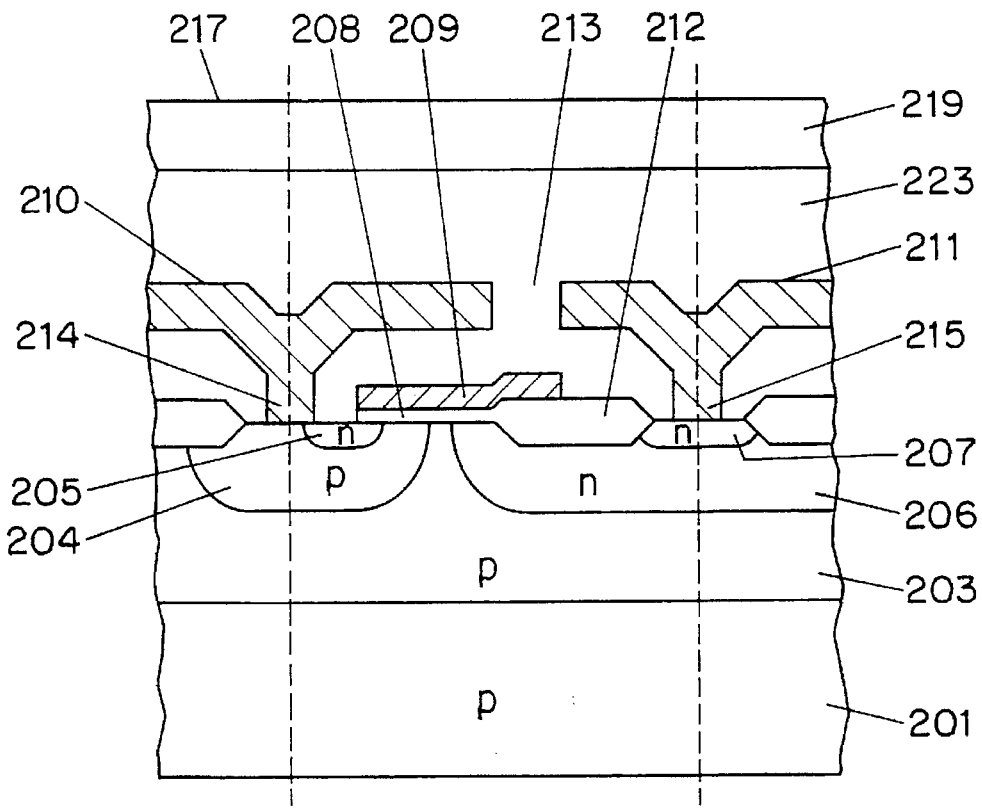
FIG. 3 is a cross section along line A—A' of FIG. 2.

FIG. 2 is a top plan view showing an electrode arrangement on a chip 200 of a first embodiment of a lateral MOSFET according to the present invention. The device shown in FIG. 2 is a lateral n-channel DMOSFET. FIG. 3 is a cross section of the DMOSFET along line A—A' of FIG. 2.

Referring now to FIG. 3, a p-type well region 203 is formed on a p-type substrate 201. A p-type base region 204 and an n-type source region 205 are self-aligned in a surface layer of the p-type well region 203 by using the edge of a gate electrode 209. An n-type offset region 206 is formed in the surface layer of the p-type well region 203. A narrow channel separates the n-type offset region 206 from the p-type base region 204. A thick oxide film (LOCOS) 212 is formed on a part of the n-type offset region 206. An n-type drain region 207 is also formed a part of the n-type offset region 206 away from the p-type base region 204. A polycrystalline silicon gate electrode 209 is fixed via a gate oxide film 208 to the portions of the p-type base region 204 and the p-type well region 203 extending between the n-type source region 205 and the n-type offset region 206.

A first source electrode layer 210 is fixed commonly to the n-type source region 205 and the p-type base region 204 via a source contact 214. The first source electrode layer 210 is extended above an inter-layer insulation film 213 and is wider than the source contact 214. A first drain electrode layer 211 is fixed to the n-type drain region 207 via a drain contact 215. The first drain electrode layer 211 is also extended above the inter-layer insulation film 213 and is wider than the drain contact 215. The first source electrode layer 210 is separated from the first drain electrode layer 211 by the inter-layer insulation film 213.

A second drain electrode layer 219 is disposed above the electrode layers 210 and 211 on an inter-layer insulation film 223. The first drain electrode layer 211 and the second drain electrode layer 219 are not connected with one another in the line A—A' of FIG. 2. Though a passivation film is formed on the second drain electrode layer 219, the passivation film is removed in the illustrated section of FIG. 3 to form a drain pad 217. Since the p-type base region 204 shown in FIG. 3 is the outermost tooth of the combtooth-like p-type base region, the LOCOS 212 is disposed but the n-type source region is not formed on the left hand side of the outermost tooth of the combtooth-like p-type base region 204. The other parts of FIG. 3 are structural inversions and repetitions of the zone illustratively delimited by the dotted lines.

Referring now to FIG. 2, double electrode layers are illustrated by bold solid lines and bold broken lines. In the figure, the bold broken lines indicate the first electrode layers disposed on the underside. The combtooth-like first source electrode layer 210 and the combtooth-like first drain electrode layer 211 are arranged interdigitally with one another. Regions surrounded by the fine dotted lines and located inside the bold broken lines represent the source contact 214 contacting the n-type stripe source region 205 and the drain contact 215 contacting the n-type stripe drain region 207. A region surrounded by the bold solid lines and located on the upper part of FIG. 2 represents the second drain electrode layer 219. A region surrounded by the bold solid lines and located on the lower part of FIG. 2 represents the second source electrode layer 218.

The first source electrode layer indicated by the bold broken lines and second source electrode layer indicated by the bold solid lines are connected via a source connection hole 220, represented by a hatched region, to the stripes of the source region 205. Similarly, the first drain electrode layer indicated by the bold broken lines and second drain electrode layer indicated by the bold solid lines are connected via a drain connection hole 221, represented by a hatched region, to the stripes of the drain region 207. The other parts are insulated by the inter-layer insulation film 223.

The passivation film is removed from the most parts above the second source electrode layer 218 and the second drain electrode layer 219 so that a source pad 216 and a drain pad 217 for facilitating wire bonding may be disposed thereon. Additionally, a gate pad 224 contacts the gate electrode 209. Since the illustrated field effect transistor is driven by applying a voltage and controllable with a relatively small current, the gate pad is relatively small and may be located on the periphery of the chip 200.

Figure 10:
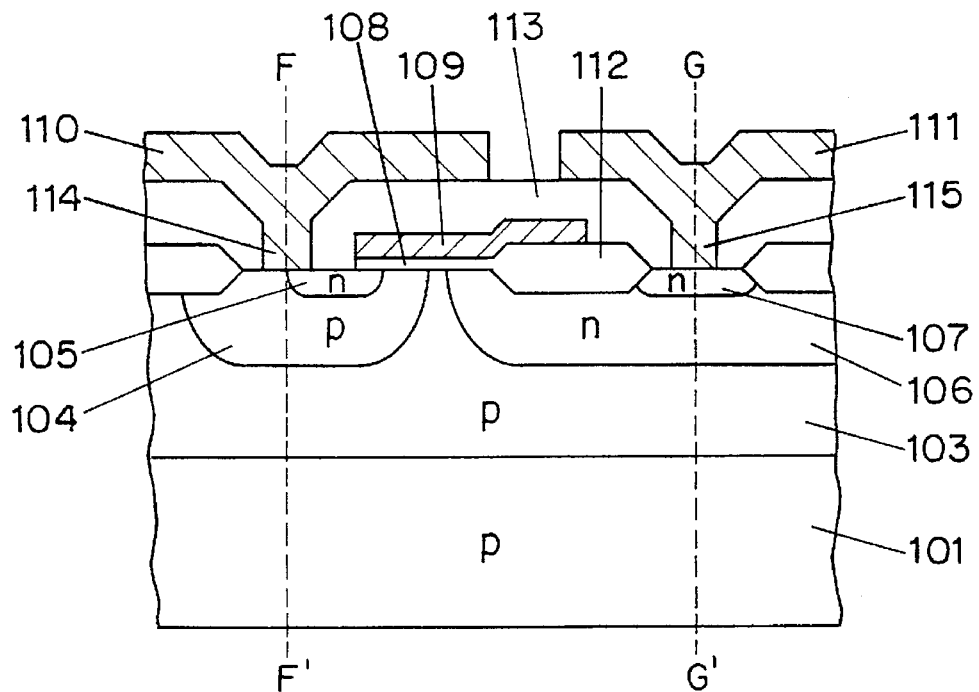
FIG. 10 is a cross section of a lateral MOSFET according to the prior art.

The lateral MOSFET of the first embodiment operates in the same way as the conventional MOSFET of FIG. 10. Moreover, the lateral MOSFET of the first embodiment has a relatively small chip area since the source pad 216 and the drain pad 217 are formed above the stripes of the source and drain regions. Since the active area for current flow is widened while maintaining the same chip area, the on-resistance is thus lowered.

Figure 5:
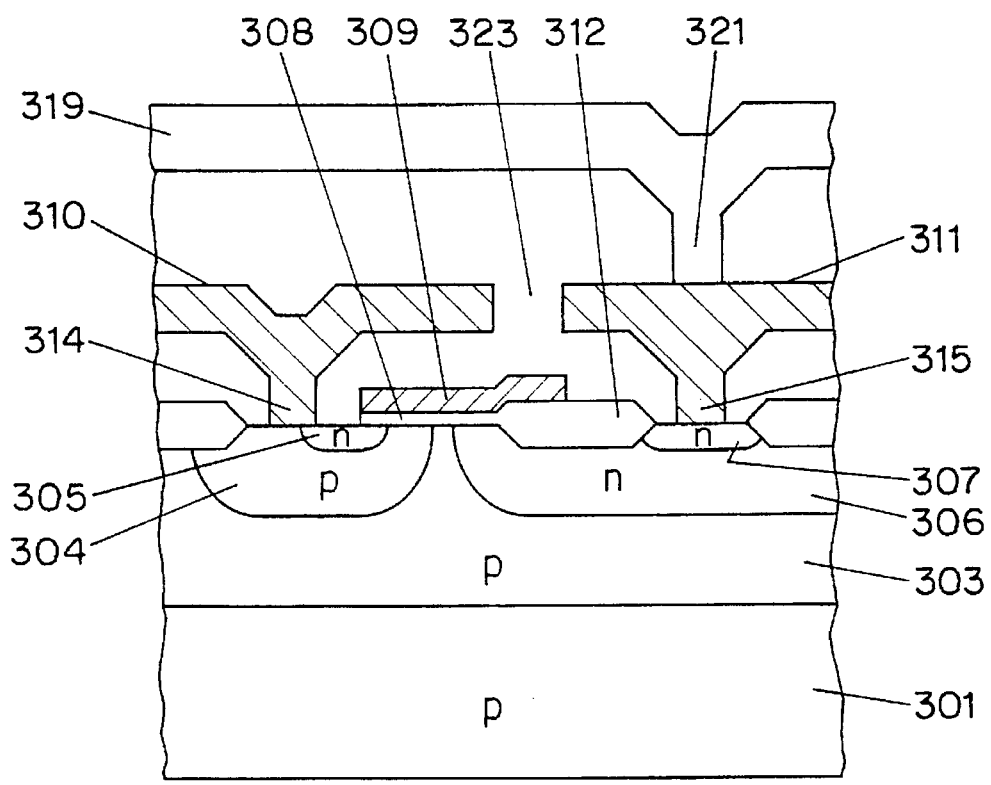
FIG. 5 is a cross section along line B—B' of FIG. 4.
Figure 4:
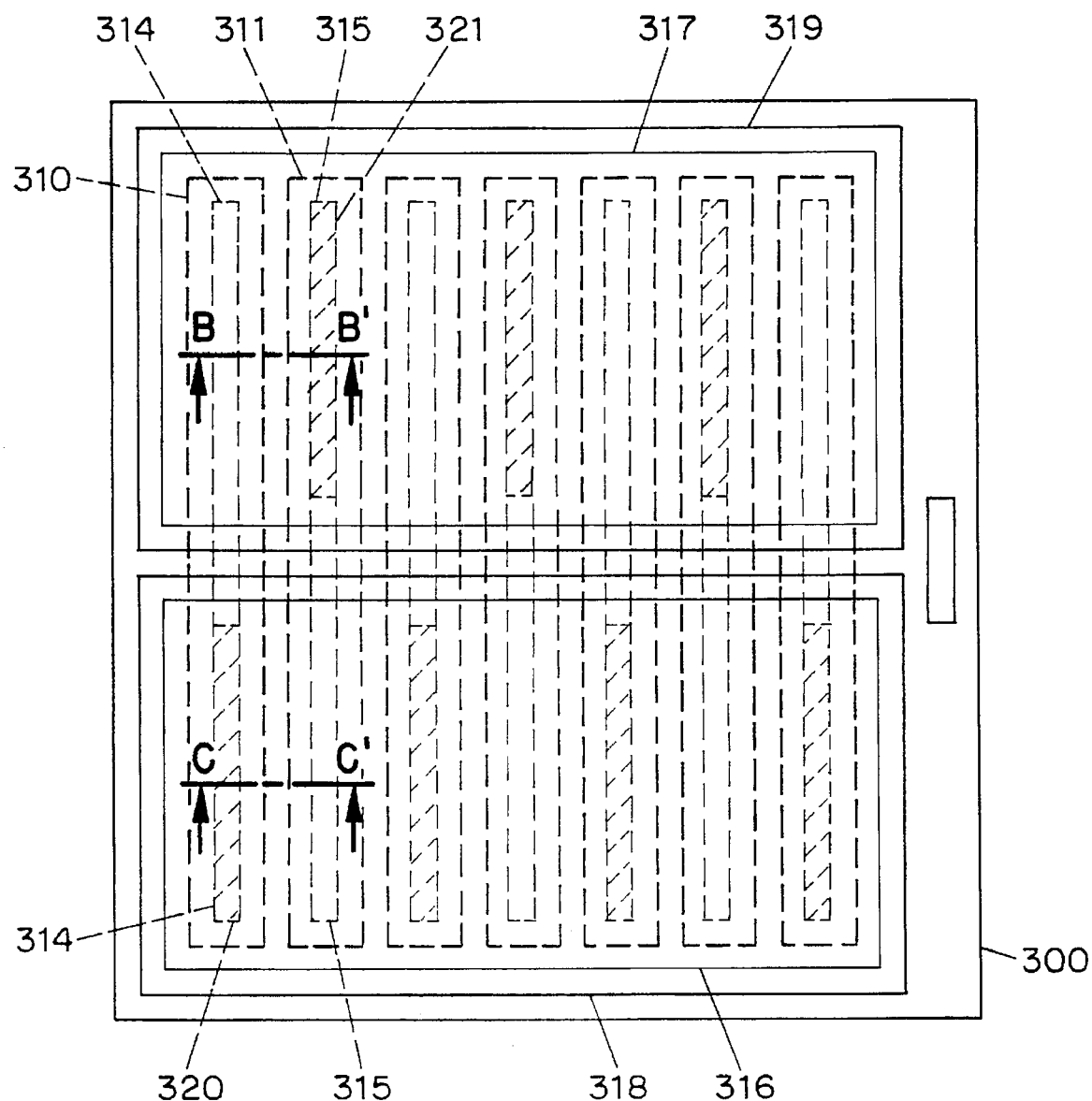
FIG. 4 is a top plan view of the second embodiment of a lateral MOSFET according to the present invention.
Figure 6:
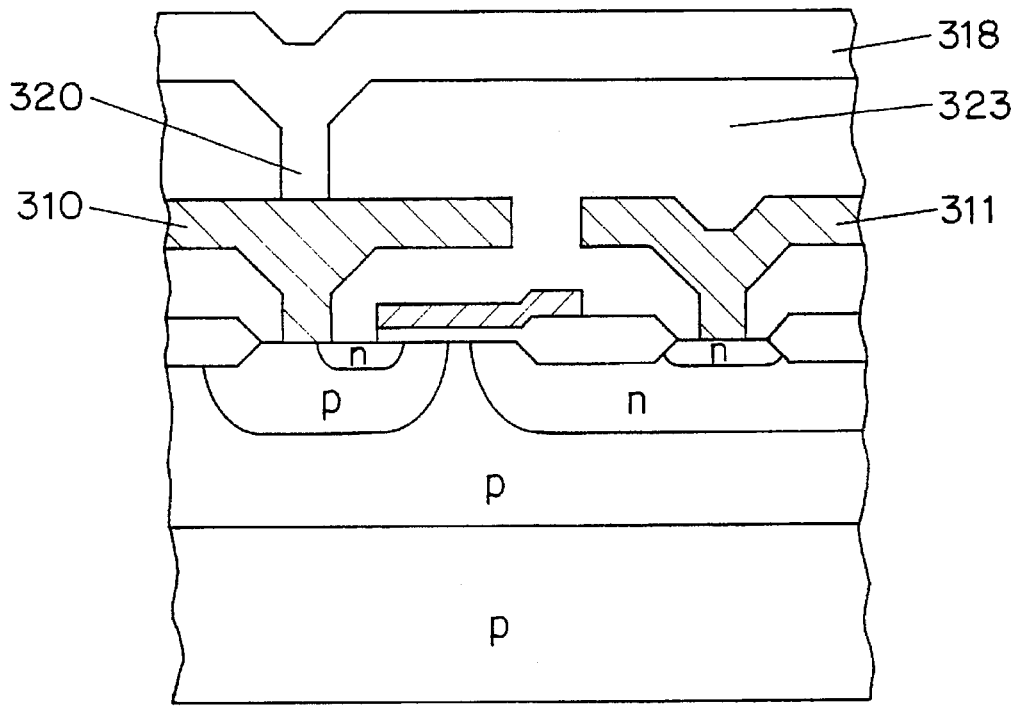
FIG. 6 is a cross section along line C—C' of FIG. 4.

FIG. 4 is a top plan view showing an electrode arrangement on a chip 300 of a second embodiment of a lateral MOSFET according to the present invention. The device of FIG. 4 is a lateral n-channel DMOSFET. FIG. 5 is a cross section along line B—B' of FIG. 4. FIG. 6 is a cross section along line C—C' of FIG. 4.

Referring now to FIG. 5, a p-type well region 303 is formed on a p-type substrate 301. A p-type base region 304, an n-type source region 305, an n-type offset region 306, a LOCOS film 312, an n-type drain region 307, a gate oxide film 308 and a gate electrode 309 are formed on the p-type well region 303 as in the first embodiment. A first source electrode layer 310 is fixed commonly via a source contact 314 to a stripe of the n-type source region 305 and a stripe of the p-type base region 304. A first drain electrode layer 311 is fixed via a drain contact 315 to a stripe of the n-type drain region 307. A second drain electrode layer 319, disposed above the first source electrode layer 310 and the first drain electrode layer 311 on an inter-layer insulation film 323, is connected, unlike in the first embodiment, to the first drain electrode layer 311 via drain connection holes 321 as shown in FIG. 4.

Similarly, referring now to FIG. 6, a second source electrode layer 318 is disposed above the first source electrode layer 310 and the first drain electrode layer 311 on the inter-layer insulation film 323. The second source electrode layer 318 is also connected to the first source electrode layer 310 via source connection holes 320 as shown in FIG. 4.

Referring now to FIG. 4, double electrode layers are illustrated by bold solid lines and bold broken lines. The bold broken lines indicate the first electrode layers disposed on the underside. The first source electrode layer stripes 310 are spaced alternately with the first drain electrode layer stripes 311.

Regions surrounded by the fine dotted lines and located inside the bold broken lines represent the source contacts 314 contacting the stripes of the n-type source region 305 and the drain contacts 315 contacting the stripes of the n-type drain region 307. A region surrounded by the bold solid lines and located on the upper part of FIG. 4 represents the second drain electrode layer 319. A region surrounded by the bold solid lines and located on the lower part of FIG. 4 represents the second source electrode layer 318.

The first source electrode layer indicated by the bold broken lines and the second source electrode layer indicated by the bold solid lines are connected via source connection holes 320 represented by hatched regions and disposed above the stripes of the source region 305. The first drain electrode layer indicated by the bold broken lines and the second drain electrode layer indicated by the bold solid lines are connected via drain connection holes 321 represented by hatched regions and disposed above the stripes of the drain region 307. The other parts are insulated by the inter-layer insulation film 323. The passivation film is removed from the most parts above the second source electrode layer 318 and the second drain electrode layer 319 so that a source pad 316 and a drain pad 317 for facilitating wire bonding may be disposed thereon. A gate is formed between the source and the drain.

The lateral MOSFET of the second embodiment operates in the same way as the conventional MOSFET of FIG. 10.

The lateral MOSFET of the second embodiment has a relatively small chip area since the source pad 316 and the drain pad 317 are formed above the stripes of the source and drain regions. Since the active area for current flow is widened while maintaining the same chip area, the on-resistance is thus lowered.

Moreover, since the connection holes 320 and 321 for connecting the first electrode layers to the second electrode layers are located beneath the second electrode layers, a source current flows only vertically from the source region located beneath the source pad 316 to the second source electrode layer 318. Thus, the source current path is very short and the wiring resistance is extremely low. Similarly, since a drain current flows only vertically from the drain region located beneath the drain pad 317 to the second drain electrode layer 319, the drain current path is very short and the wiring resistance is extremely low.

Figure 1:
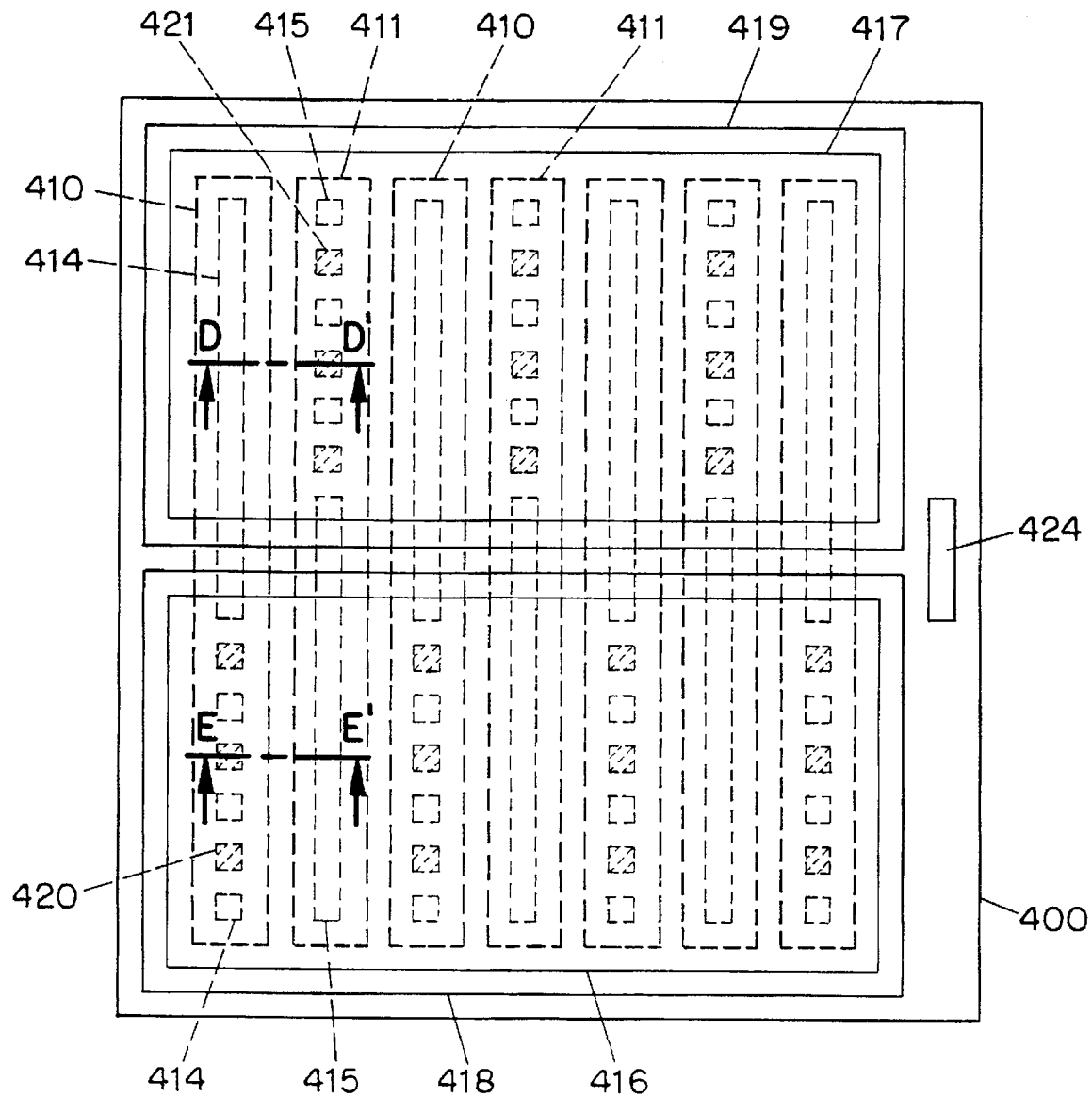
FIG. 1 is a top plan view of the third embodiment of a lateral MOSFET according to the present invention.
Figure 7:
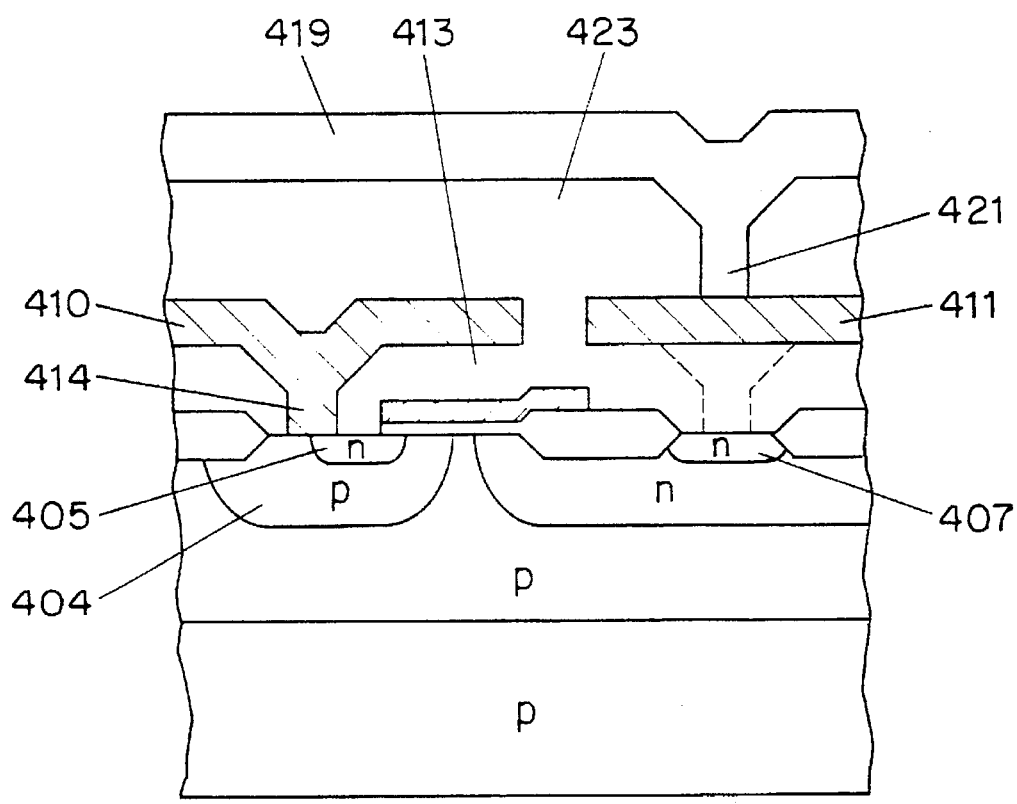
FIG. 7 is a cross section along line D—D' of FIG. 1.
Figure 8:
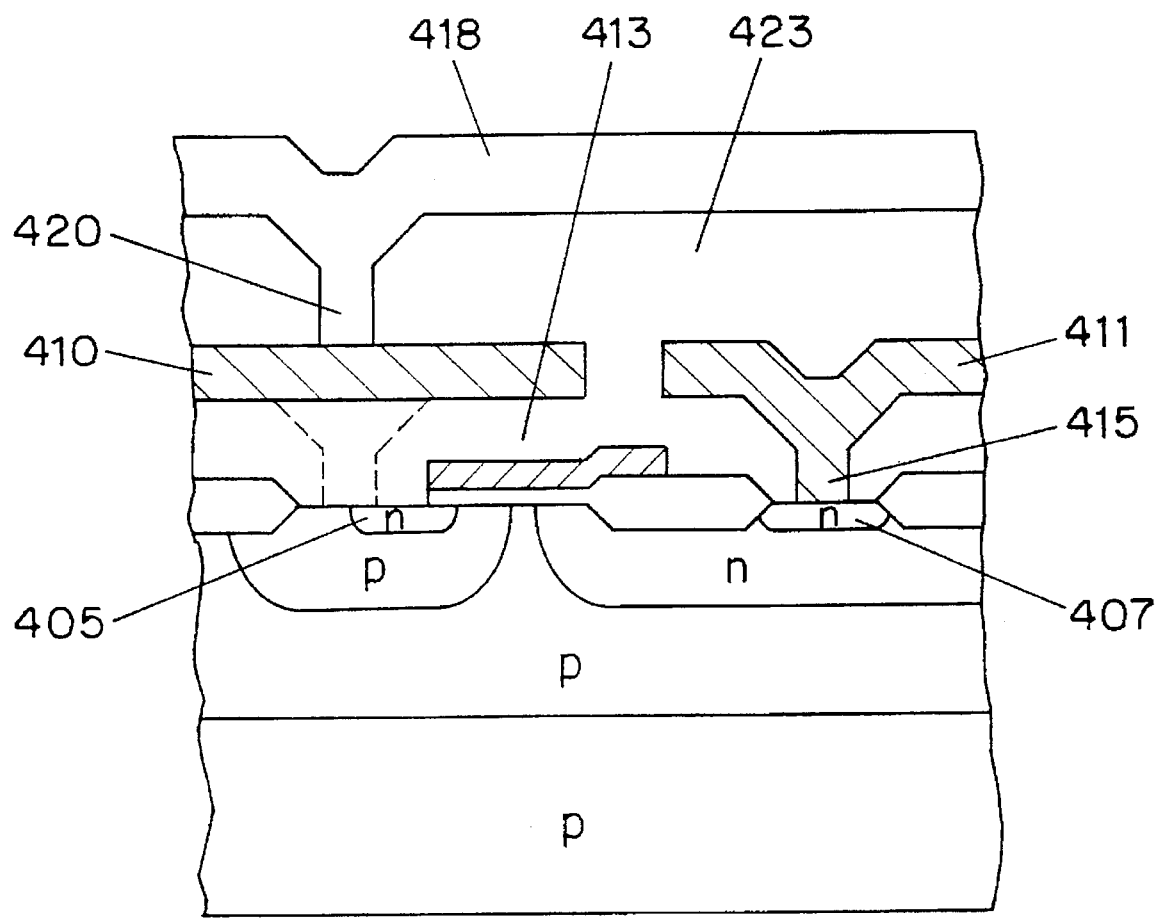
FIG. 8 is a cross section along line E—E' of FIG. 1.

FIG. 1 is a top plan view showing an electrode arrangement on a chip 400 of a third embodiment of a lateral MOSFET according to the present invention. The device shown in FIG. 1 is a lateral n-channel DMOSFET. FIG. 7 is a cross section along line D—D' of FIG. 1. FIG. 8 is a cross section along line E—E' of FIG. 1. Since the semiconductor regions are formed on the semiconductor substrate as in the first and second embodiments, the following explanation will focus on the electrode configuration.

Referring now to FIG. 7, a first source electrode layer 410 is fixed commonly via a source contact 414 to a stripe of an n-type source region 405 and a stripe of a p-type base region 404. A first drain electrode layer 411 is disposed above an n-type drain region 407. As shown in FIG. 7, the first drain electrode layer 411 does not contact the n-type drain region 407. The first source electrode layer 410 is extended onto an inter-layer insulation film 413 and is wider than the source contact 414. The first source electrode layer 410 is separated from the first drain electrode layer 411 by the inter-layer insulation film 413 and is not connected to the first drain electrode layer 411. A second drain electrode layer 419 is disposed above the first source electrode layer 410 and the first drain electrode layer 411 on an inter-layer insulation film 423. The second drain electrode layer 419 is connected to the first drain electrode layer 411 via drain connection holes 421. A passivation film formed on the second drain electrode layer 419 is not illustrated in this cross section.

Referring now to FIG. 8, the first drain electrode layer 411 is fixed via a drain contact 415 to a stripe of an n-type drain region 407. The first source electrode layer 410 is disposed above the n-type source region 405. As shown in FIG. 8, the first source electrode layer 410 does not contact the n-type source region 405. The first drain electrode layer 410 is extended onto the inter-layer insulation film 413 and is wider than the drain contact 415. The first drain electrode layer 411 is separated from the first drain electrode layer 410 by the inter-layer insulation film 413 and is not connected with the first drain electrode layer 410. The second source electrode layer 418 is disposed above the first source electrode layer 410 and the first drain electrode layer 411 on an inter-layer insulation film 423. The second source electrode layer 418 is connected to the first source electrode layer 410 via source connection holes 420. A passivation film formed on the second source electrode layer 418 is not illustrated in this cross section.

Referring now to FIG. 1, double electrode layers are illustrated by bold solid lines and bold broken lines. The bold broken lines indicate the first electrode layers disposed on the underside. The stripes of the first source electrode layer 410 are spaced alternately with the stripes of the first drain electrode layer 411.

Regions surrounded by the fine dotted lines and located inside the bold broken lines represent the source contact 414 contacting a stripe of the n-type source region 405 and the drain contact 415 contacting a stripe of the n-type drain region 407. A region surrounded by the bold solid lines and located on the upper part of FIG. 1 represents the second drain electrode layer 419. A region surrounded by the bold solid lines and located on the lower part of FIG. 1 represents the second source electrode layer 418.

The first source electrode layer indicated by the bold broken lines and the second source electrode layer indicated by the bold solid lines are connected via source connection holes 420 represented by hatched regions. The first drain electrode layer indicated by the bold broken lines and the second drain electrode layer indicated by the bold solid lines are connected via drain connection holes 421 represented by hatched regions. The other parts are insulated by the inter-layer insulation film 423.

Each source contact 414 located beneath the second drain electrode layer 419 is formed in a linear stripe as shown in the FIG. 1. Similarly, each drain contact 415 beneath the second source electrode layer 418 is formed in a linear stripe. The drain contact 415 is spaced alternately with the drain connection hole 421 beneath the second drain electrode layer 419 as shown in FIG. 1. Similarly, the source contact 414 is spaced alternately with the source connection hole 420 beneath the second source electrode layer 418 as shown in the figure. The passivation film is removed from most parts above the second source electrode layer 418 and the second drain electrode layer 419 so that a source pad 416 and a drain pad 417 for facilitating wire bonding may be disposed thereon. A gate is formed between the source and the drain.

The first source electrode layer 410 tends to sink where the first source electrode layer 410 contacts the source contact 414, as shown in FIG. 7. It is then difficult to completely fill the source connection hole 420 by depositing the second source electrode layer 418. Therefore, the contact resistance between the first and second source electrode layers 410, 418 tends to rise. To avoid this problem, it is necessary to fill the source contact 414 completely and to flatten the first source electrode layer 410. To avoid these cumbersome processing steps, the source contact 414 and the source connection hole 420 are displaced laterally from one another. Additionally, the drain contact 415 and the drain connection hole 421 are displaced laterally from one another. Though the cross sections of the source connection hole 420 and the drain connection hole 421 are smaller than the cross sections of the second embodiment, the reduced cross section does not affect the resistance much, since the distance between the first and second electrode layers is short.

An experimental n-channel lateral MOSFET having the structure of the third embodiment was manufactured. The distance between the center of the source region stripe and the center of the drain region stripe, determined almost uniquely by the breakdown voltage class of the device, was set at 7.8 µm. The half width of the first source electrode layer 410 and the half width of the first drain electrode layer 411 were set at 3.3 µm. The first source electrode layer 410 and the first drain electrode layer 411 were spaced by 1.2 µm. The device was 1.5 mm in height, 3.4 mm in width, and 5.1 mm$^2$ in area. The on-resistance per unit area inside the device was 0.2 Ω/mm$^2$. The sheet resistance of the first layer aluminum wiring was 0.02 Ω/□. The on-resistance inside the device was 40 mΩ. The resistance of the first layer aluminum wiring was 10 mΩ. Thus, the overall on-resistance was 50 mΩ.

Figure 11:
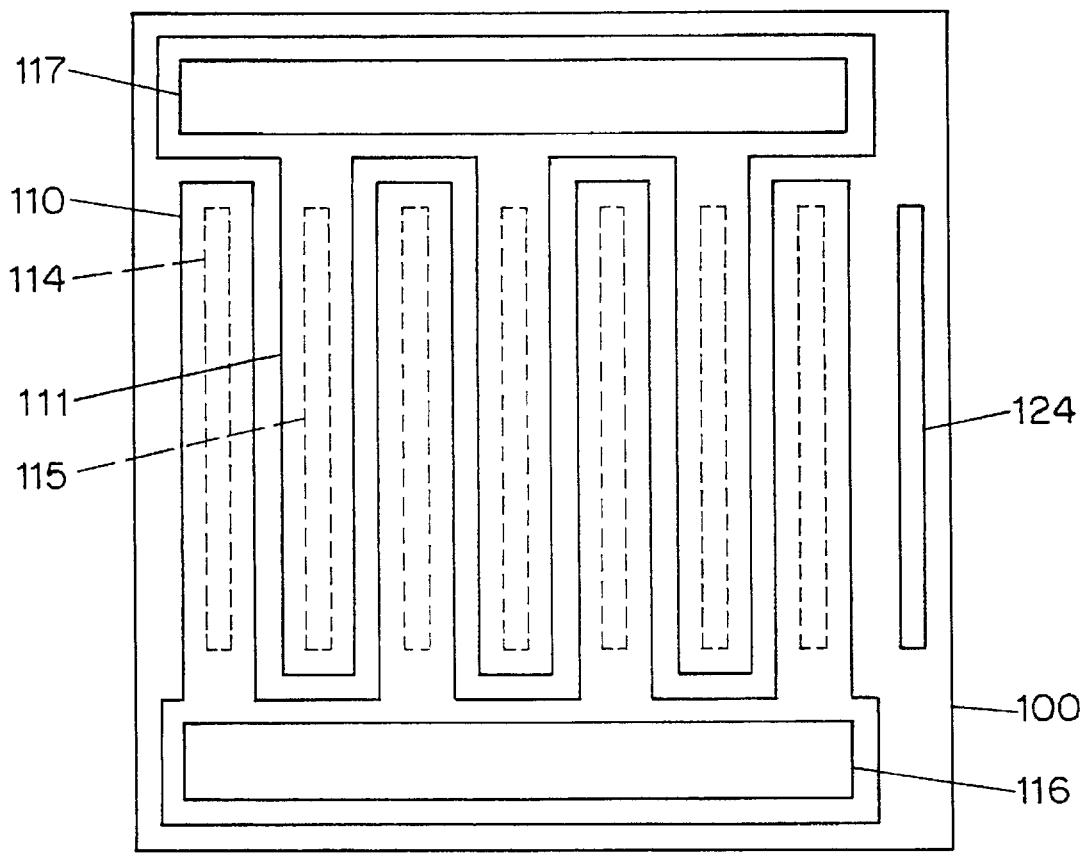
FIG. 11 is a top plan view of the lateral MOSFET of FIG. 10.

Since the wiring resistance of the first electrode layers of the conventional n-channel lateral MOSFET of FIG. 11 is 20 mΩ, twice as large as that of the experimental device at the same device size (excluding the pad area), the on-resistance is improved 17%. Additionally, the chip area is reduced 21%, from a conventional MOSFET pad area of 1.36 mm$^2$ (3.4 mm×0.2 mm×2). Moreover, the n-channel lateral MOSFET of the invention allows using a bonding wire of 500 µm in diameter, much thicker than the conventional bonding wire of 50 µm in diameter, and therefore facilitates reducing the wire bonding resistance.

Figure 9:
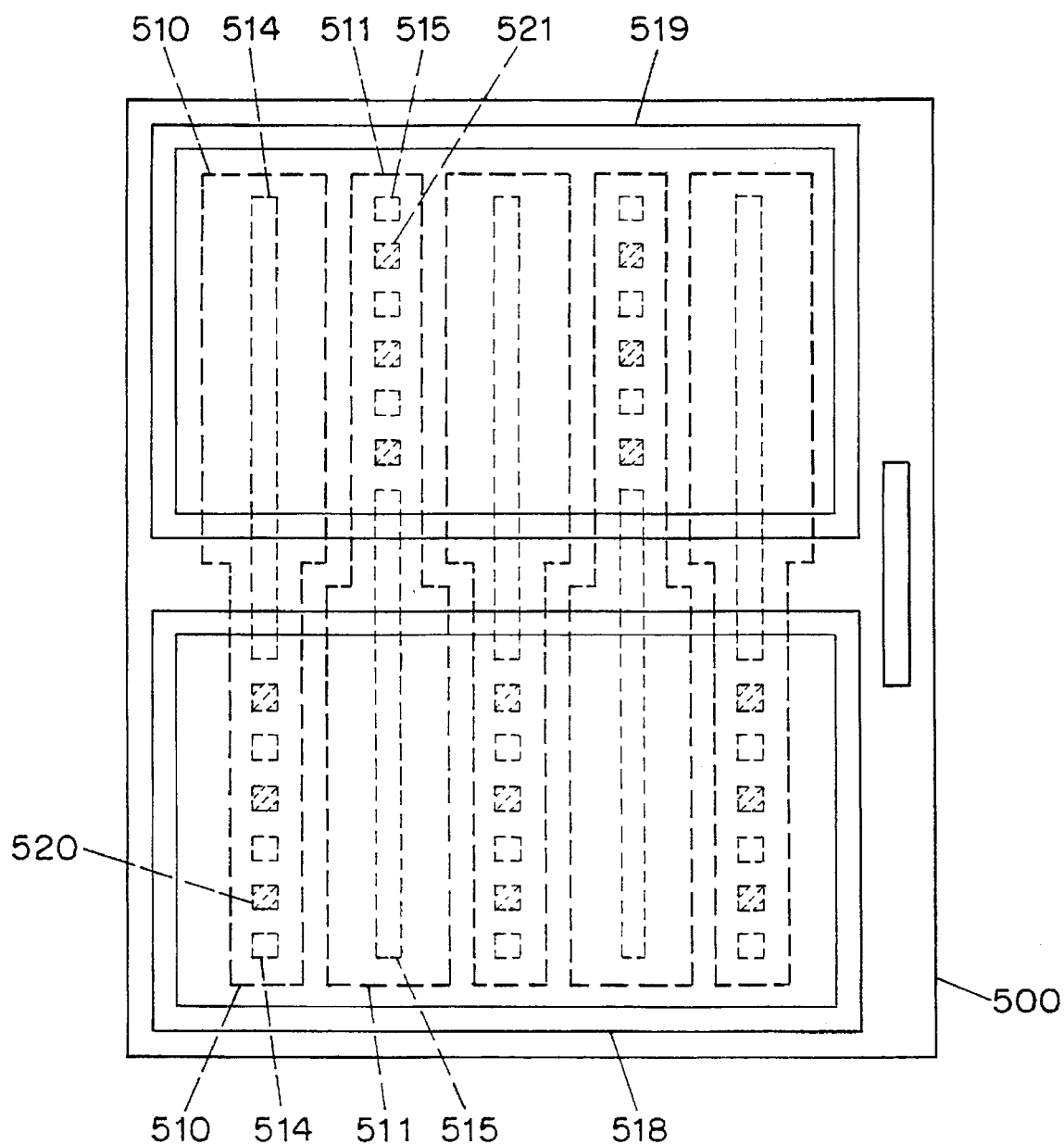
FIG. 9 is a top plan view of the fourth embodiment of a lateral MOSFET according to the present invention.

FIG. 9 is a top plan view showing an electrode arrangement on a chip 500 of a fourth embodiment of a lateral MOSFET according to the present invention. The device shown in FIG. 9 has a source electrode and a drain electrode formed in stripes as in the third embodiment. Additionally, the wiring structure is almost the same as that of the third embodiment.

In FIG. 9, the width of a first source electrode layer 510 beneath the second source electrode layer 518 is 1.3 µm including the minimum design rule value of 0.8 µm corresponding to the portion overlapping a source contact 514. Since the distance between the stripe centers of the source and drain regions is the same as that of the third embodiment at the same breakdown voltage class, the width of the first drain electrode layer 511 is widened to 5.3 µm. Similarly, the width of the first source electrode layer 510 beneath the second drain electrode layer 519 is widened to 5.3 µm. Therefore, the wiring resistance is reduced 34% to 6.5 mΩ for a device size of 1.5 mm in height and 3.4 mm in width. Thus, the overall on-resistance is reduced 7.0% to 46.5 mΩ.

We claim:

1. A lateral field effect transistor comprising:
   a semiconductor substrate;
   a source region comprising source region stripes formed on said semiconductor substrate;
   a drain region comprising drain region stripes formed on said semiconductor substrate and spaced laterally from said source region stripes;
   a source electrode comprising a first source electrode layer connected to said source region via at least one source contact and a second source electrode layer straddling said source region stripes and said drain region stripes, said first source electrode layer and said second source electrode layer being separated by an inter-layer insulation film and connected via at least one source connection hole formed through said inter-layer insulation film; and
   a drain electrode comprising a first drain electrode layer connected to said drain region via at least one drain contact and a second drain electrode layer straddling said source region stripes and said drain region stripes, said first drain electrode layer and said second drain electrode layer being separated by an inter-layer insulation film and connected via at least one drain connection hole formed through said inter-layer insulation film.

2. The lateral field transistor of claim 1, further comprising a source pad disposed on said second source electrode layer.

3. The lateral field transistor of claim 1, further comprising a drain pad disposed on said second drain electrode layer.

4. The lateral field effect transistor of claim 1, wherein said at least one source connection hole is formed beneath said second source electrode layer, and said at least one drain connection hole is formed beneath said second drain electrode layer.

5. The lateral field effect transistor of claim 4, wherein said at least one source connection hole is disposed above said source region stripes, and said at least one drain connection hole is disposed above said drain region stripes.

6. The lateral field effect transistor of claim 5, wherein said at least one source contact and said at least one source connection hole are displaced laterally from one another, and said at least one drain contact and said at least one drain connection hole are displaced laterally from one another.

7. The lateral field effect transistor of claim 1, wherein:

beneath said second drain electrode layer, said first source electrode layer is wider than said first drain electrode layer, and beneath said second source electrode layer, said first drain electrode layer is wider than said first source electrode layer.

\* \* \* \* \*